(12) United States Patent
Lee

(10) Patent No.: US 7,316,958 B2
(45) Date of Patent: Jan. 8, 2008

(54) MASKS FOR FABRICATING SEMICONDUCTOR DEVICES AND METHODS OF FORMING MASK PATTERNS

(75) Inventor: Jun Seok Lee, Goyang (KR)

(73) Assignee: Dongbu Electronics Co., Ltd., Seoul (KR)

( * ) Notice: Subject to any disclaimer, the term of this patent is extended or adjusted under 35 U.S.C. 154(b) by 43 days.

(21) Appl. No.: 11/022,612

(22) Filed: Dec. 27, 2004

(65) Prior Publication Data

US 2005/0142456 A1    Jun. 30, 2005

(30) Foreign Application Priority Data

Dec. 27, 2003    (KR) ...................... 10-2003-0098325

(51) Int. Cl.
*H01L 21/336* (2006.01)
(52) U.S. Cl. ............... 438/296; 438/949; 257/E21.206; 257/E21.507; 257/E21.59
(58) Field of Classification Search ................ 438/592, 438/633, 296, 949; 257/E21.206, E21.507, 257/E21.59
See application file for complete search history.

(56) References Cited

U.S. PATENT DOCUMENTS 6,767,824 B2 * 7/2004 Nallan et al. ............... 438/633

2003/0203580 A1 * 10/2003 Choo et al. ................. 438/296
2004/0029021 A1 * 2/2004 Garza et al. ................... 430/5

FOREIGN PATENT DOCUMENTS

KR    10-2003-0054070    7/2003

* cited by examiner

*Primary Examiner*—Walter Lindsay, Jr.
(74) *Attorney, Agent, or Firm*—Andrew D. Fortney

(57) ABSTRACT

Masks for fabricating a semiconductor device and methods of forming mask patterns are provided which are capable of enhancing the breakdown voltage of the fabricated semiconductor device by accurately correcting a line width pattern error of a semiconductor substrate due to a mask error during a process for forming a well ion implantation mask pattern. A disclosed mask used to manufacture a semiconductor device having complementary N-well and P-well includes: a master mask for the complementary N-well and P-well; and a light-blocking pattern on the master mask, wherein a region of the master mask, which is not a portion of the master mask adjacent to the light-blocking pattern, is etched by a predetermined thickness to have a phase shifting function.

14 Claims, 8 Drawing Sheets

MASKS FOR FABRICATING SEMICONDUCTOR DEVICES AND METHODS OF FORMING MASK PATTERNS

FIELD OF THE DISCLOSURE

The present disclosure relates generally to semiconductor fabrication, and more particularly, to masks for fabricating semiconductor devices and methods of forming mask patterns.

BACKGROUND

In general, a mask pattern forming technique has an important effect on the accuracy of patterns formed on a semiconductor substrate. In particular, if an optical proximity effect of the mask pattern is not suitably treated, unwanted line width distortion may occur between lines during a lithographic exposing process and a linearity of the line width may be deteriorated. Therefore, characteristics of the semiconductor device may be degraded.

On the other hand, by using semiconductor photolithography, masks can be designed with a high accuracy, so that an amount of light passing through the masks can be suitably adjusted. In addition, an optical proximity correction technique and a phase shifting mask technique have been proposed. In addition, various approaches for minimizing light distortion effects due to mask patterns have been proposed.

Recently, a chemical amplifying resist has been developed. The chemical amplifying resist is sensitive to 248 or 194 nm extreme ultra-violet (EUV) light. By using the chemical amplifying resist, the resolution of the mask pattern can be further improved. In particular, by using dummy patterns separated from the main patterns, the optical proximity effect can be controlled to improve the resolution.

In addition, in order to form an ion implant layer, the associated resist must have an ion implantation blocking fiction as well as a photosensitive function. Therefore, a highly viscous photosensitive material is used for the resist. In particular, for a well ion implantation mask, the breakdown voltage must be stably maintained by adjusting the impurity ions during the processes for forming N-wells and P-wells.

A method of forming an inter-well region between the N-well and the P-well and of selectively overlapping the two wells has been widely used. In order to implement the method, the sizes of the N-well and the P-well must be adjusted. Namely, all the N-wells and the P-wells are adjusted to have the same size, and individual inter-well regions between the wells must be overlapped. Here, it is very important to implant the ions symmetrically.

FIG. 1A is a plan view of a conventional semiconductor device. FIG. 1B is a cross sectional view of the semiconductor device of FIG. 1A. Referring to FIG. 1A, a P-well region 20 and an N-well region 30 are partially overlapped in an area (D2). Next, N+ and P+ source/drain regions 60, 50 are formed. Next, contact holes 70 are formed on the source/drain regions 50, 60.

FIG. 1B is a cross sectional view taken along line A-B of FIG. 1A. Insulating regions 4 are formed in the semiconductor substrate 1 by using an STI (shallow trench isolation) process. An N-well 3 and a P-well 2 are formed between the insulating regions 4. The N-well 3 and P-well 2 of FIG. 1B overlap to define an overlapping region D3. In the illustrated example, reference numerals 5, 6, 8, and 9 indicate source/drain regions, an insulating layer, and a contact, respectively.

FIGS. 2A and 2B are cross sectional views showing conventional N-well and P-well masks, respectively. Referring to FIG. 2A, the N-well mask 33 includes a light-blocking layer 12 and a light-transmitting layer 11. In the example of FIG. 2A, a reference line 99 indicates an end portion used to adjust the size of the N-well. In addition, size-adjusting regions are indicated by W. FIG. 2B is similar to FIG. 2A except that FIG. 2B shows the P-well mask 34. Therefore, a detailed description of the P-well mask would be redundant to the above description of the N-well mask and is, thus, omitted. However, like structures in FIGS. 2A and 2B are referenced with like reference numerals to easily enable the reader to apply the discussion of FIG. 2A to FIG. 2B.

FIG. 3 is a picture illustrating a problem of a conventional mask. When the conventional mask is applied, the photosensitive material has a large thickness of about 1.2 μm. Therefore, in the subsequent processes of forming an N-well layer 300 and a P-well layer 200, the slope of the resist is too slow to uniformly expose the inter-well regions 90a, 90b corresponding to the regions D1 and D2 of FIG. 1A.

DETAILED DESCRIPTION

Example masks for fabricating a semiconductor device constructed in accordance with the teachings of the invention, and example methods of forming a mask pattern performed in accordance with the teachings of the present invention will now be described with reference to the accompanying drawings.

Figure 4A:
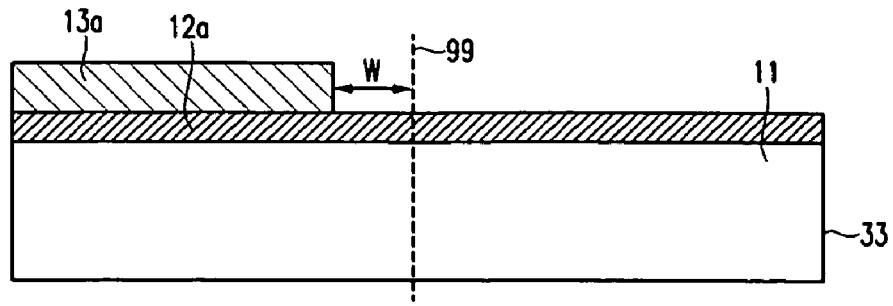
FIGS. 4A to 4E are cross sectional views illustrating an example method of forming an N-well mask of a semiconductor device performed in accordance with the teachings of the present invention.
Figure 4B:
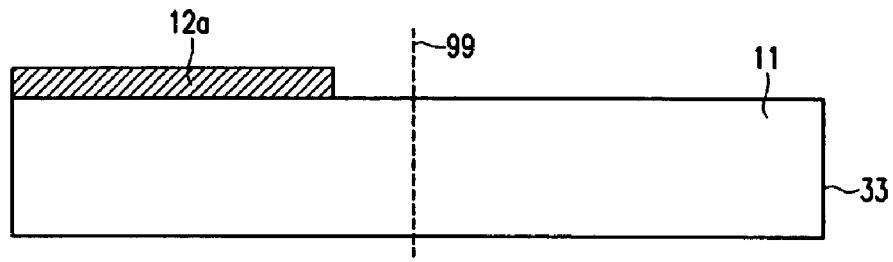

FIGS. 4A to 4E are cross sectional views illustrating an example method of forming an N-well mask constructed in accordance with the teachings of the present invention. The illustrated method seeks to enhance a slope of a resist pattern 12a having a wide slanted surface. To this end, a light blocking layer 12a is formed on a light-transmitting mask layer 11. Next, a mask 13a is formed on the light-blocking layer 12a as shown in FIG. 4A. The light blocking layer 12a is then etched and the mask 13a is removed to form a light-blocking pattern 12a as shown in FIG. 4B.

Figure 4C:
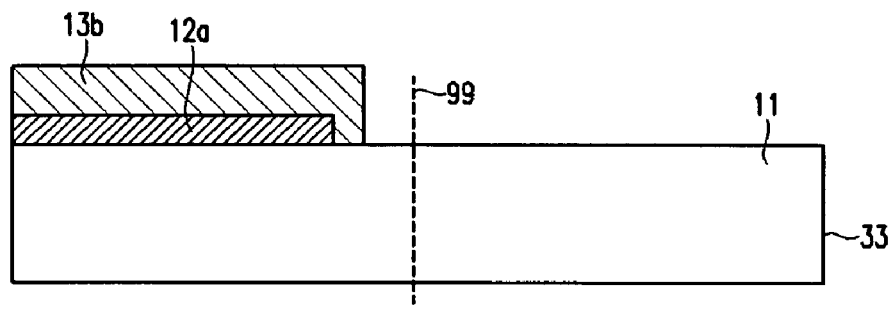

In order to adjust the size of a region W of FIGS. 4A and 4B, a photosensitive layer 13b is formed to cover the light-blocking pattern 12a for an N-well mask as shown in FIG. 4C.

Figure 4D:
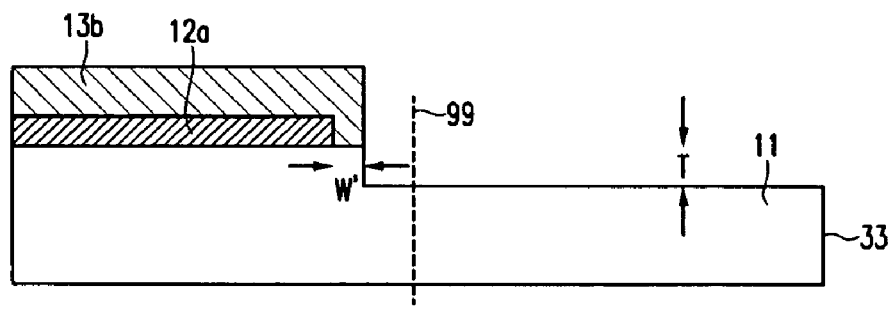
Figure 4E:
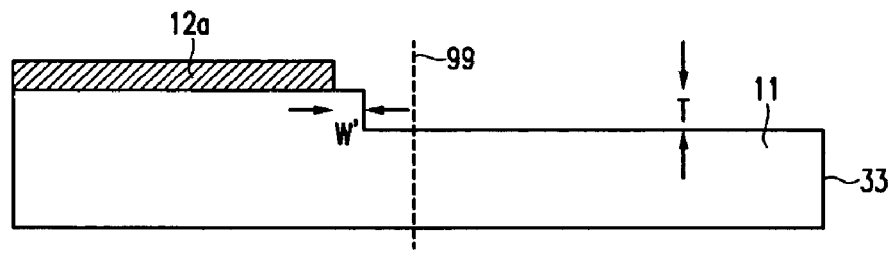

Next, as shown in FIGS. 4D and 4E, the light-transmitting mask substrate 11 is etched by a phase shifting thickness T. As a result of this etching, a non-etched region W' having a size of about 0.04 μm is formed.

Figure 5A:
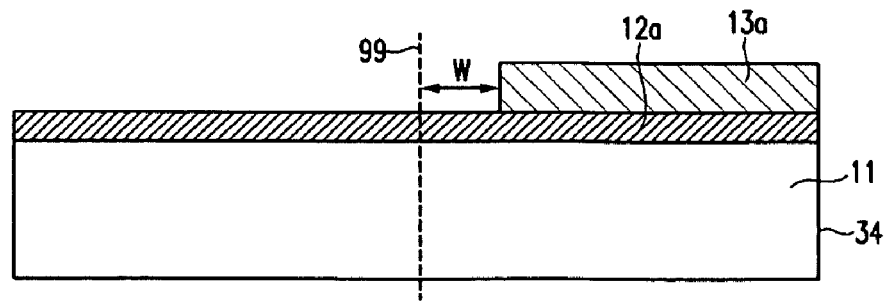
FIGS. 5A to 5E are cross sectional views showing an example method of forming a P-well mask of a semiconductor device performed in accordance with the teachings of the present invention.
Figure 5B:
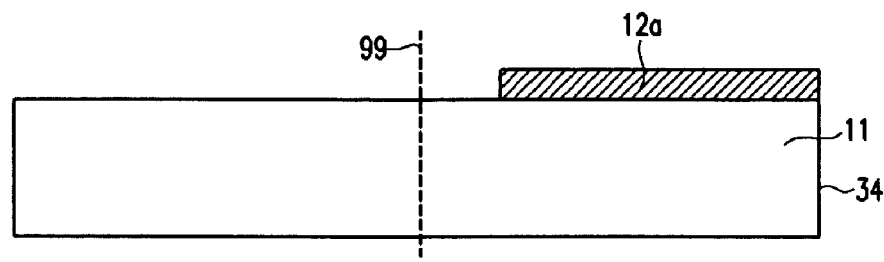

FIGS. 5A to 5E are cross sectional views illustrating an example method of forming a P-well mask constructed in accordance with the teachings of the present invention. The P-well mask is the complement to the N-well mask. An object of the method of FIGS. 5A to 5E is to enhance a slope of a resist pattern 12a having a wide slanted surface. In the example method of FIGS. 5A to 5E, a light blocking layer 12a is formed on a light-transmitting mask layer 11. Next, a mask 13a is formed on the light blocking layer 12a as shown in FIG. 5A. The light blocking layer 12a is then etched and the mask 13a is removed to form a light-blocking pattern 12a as shown in FIG. 5B.

Figure 5C:
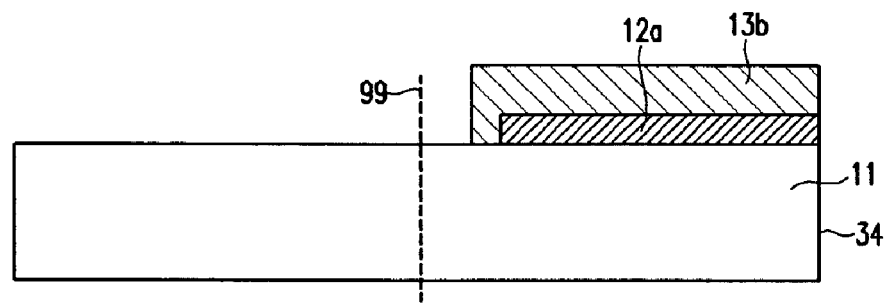

In order to adjust the size of a region W of FIGS. 5A and 5B, a photosensitive layer 13b is formed to cover the light-blocking pattern 12a for a P-well mask as shown in FIG. 5C.

Figure 5D:
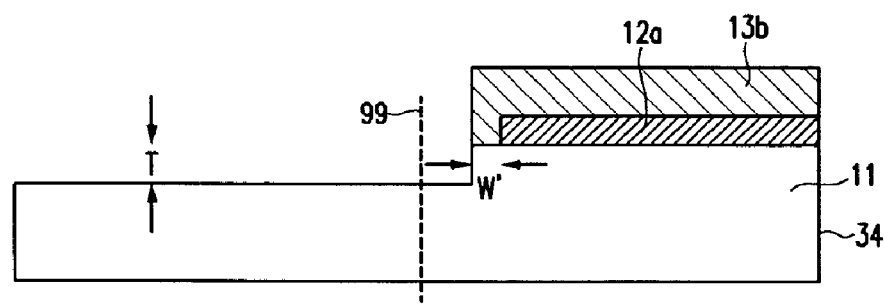
Figure 5E:
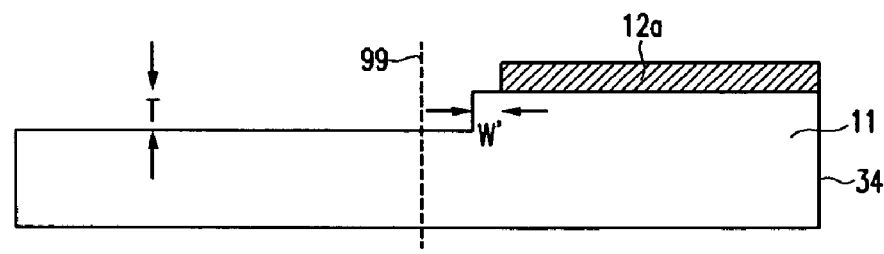

Next, as shown in FIGS. 5D and 5E, the light-transmitting mask substrate 11 is etched by a phase shifting thickness T. As a result of this etching, a non-etched region W' having a size of about 0.04 μm is formed.

Figure 6A:
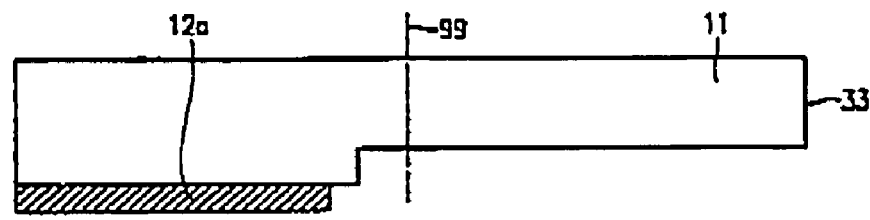
FIG. 6A is a cross sectional view showing an example N-well mask constructed in accordance with the teachings of the present invention.

FIGS. 6A to 6D illustrate optical characteristics of an example partial phase shifting mask for an N-well constructed in accordance with the teachings of the present invention. FIG. 6A is identical to FIG. 4E. Thus, a detailed description of that structure will not be repeated here.

Figure 6B:
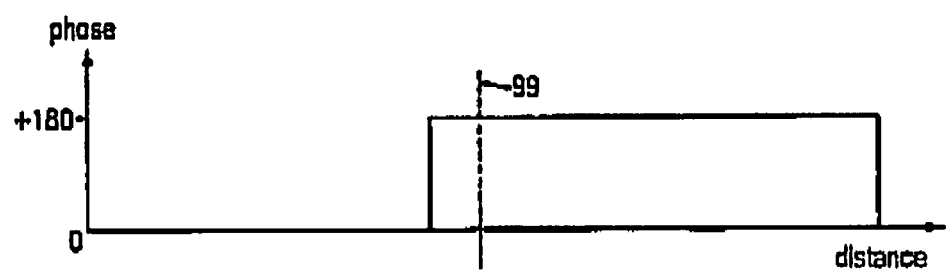
FIGS. 6B to 6D are graphs illustrating optical characteristics of a partial phase shifting mask for an N-well constructed in accordance with the teachings of the present invention.
Figure 6C:
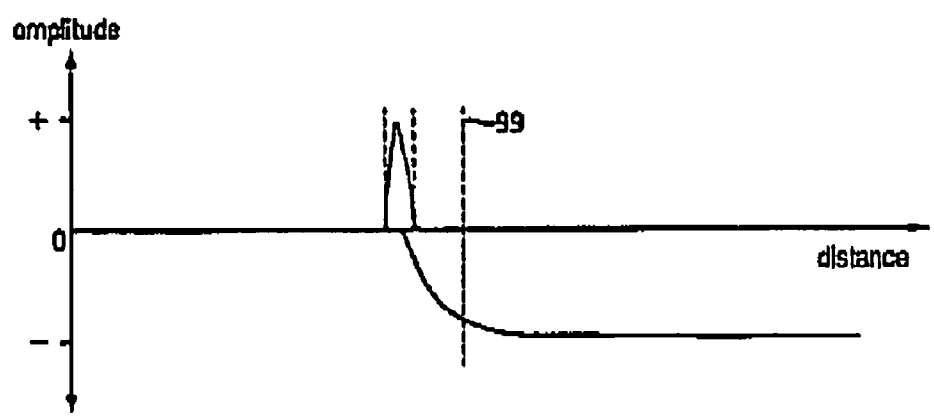
Figure 6D:
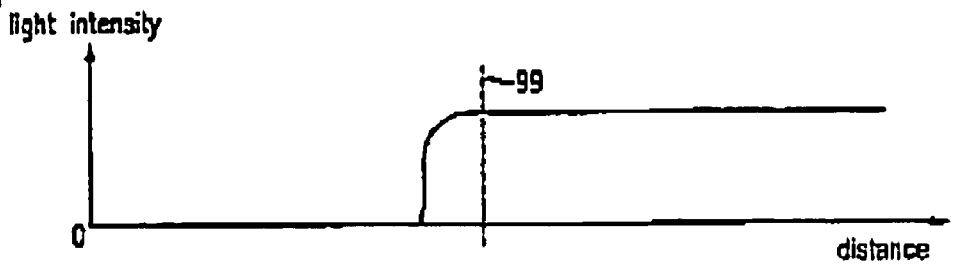

FIG. 6B illustrates a phase of light passing through the partial phase shifting mask 33 shown in FIG. 6A. The fine region W' obtained from the method of FIGS. 4A to 4E becomes a partial phase shifting region with respect to the etched regions of the substrate. An amplitude of the light passing through the partial phase shifting mask 33 has a steep positive component at the fine regions W', and a negative component in the phase shifting region. In terms of light intensity, as shown in FIG. 6D, the light intensity has a steep slope at the end portion of the phase shifting region.

Figure 7A:
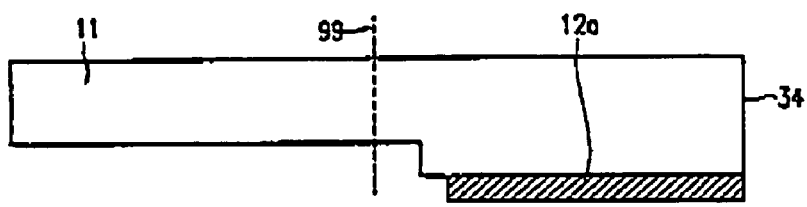
FIG. 7A is a cross sectional view showing an example P-well mask constructed in accordance with the teachings of the present invention.
Figure 7B:
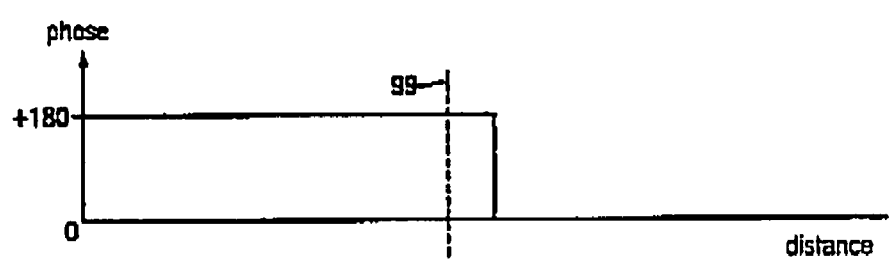
FIGS. 7B to 7D are schematic illustrations showing optical characteristics of a partial phase shifting mask for a P-well constructed in accordance with the teachings of the present invention.
Figure 7C:
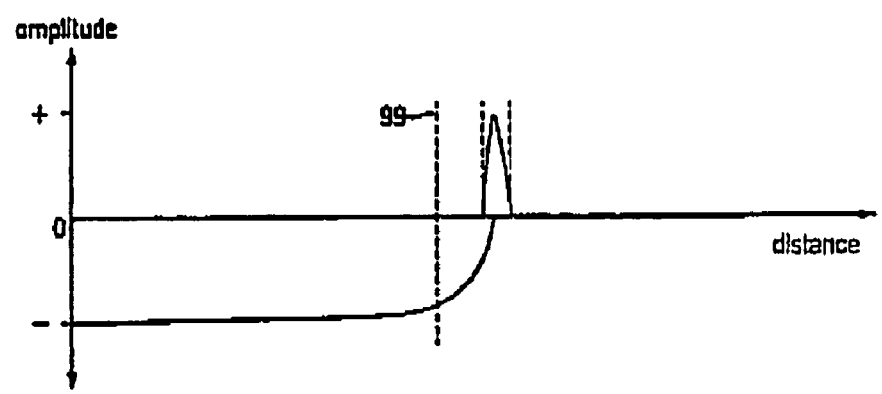
Figure 7D:
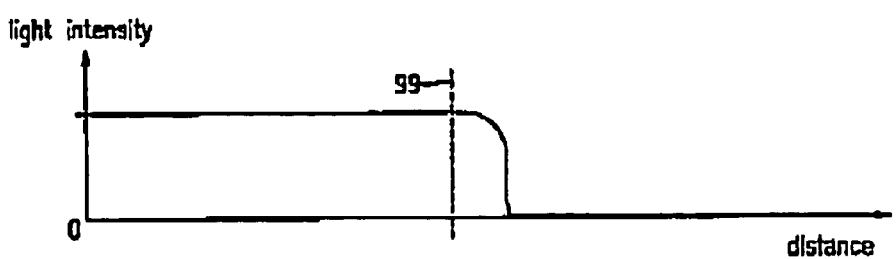

FIGS. 7A to 7D illustrate optical characteristics of an example partial phase shifting mask 33 for a P-well constructed in accordance with the teachings of the present invention. FIG. 7A is identical to FIG. 5E. Thus, a detailed description of that structure will not be repeated here. Moreover, the optical characteristics of the partial phase shifting mask 33 for the P-well are similar to those of the partial phase shifting mask 33 for the N-well shown in FIGS. 6A to 6D, but reversed. Therefore, a detailed description thereof would be redundant and, in the interest of brevity, is omitted.

Figure 1A:
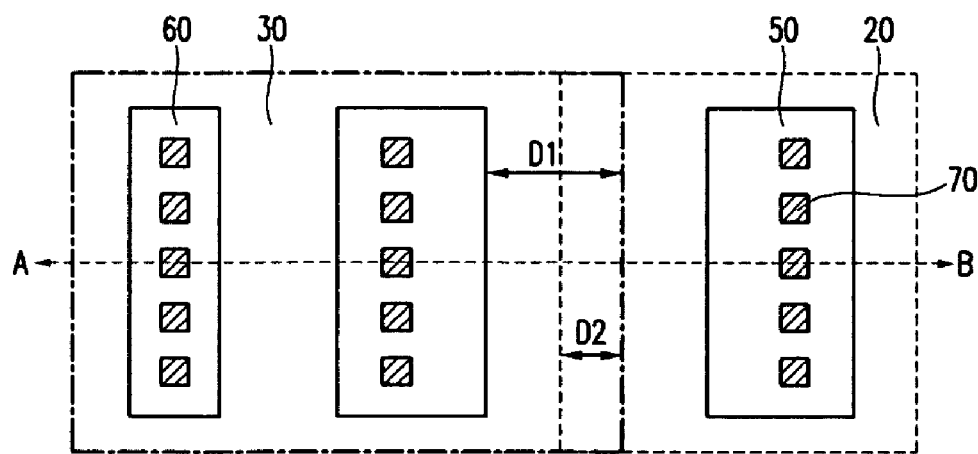
FIG. 1A is a plan view of a conventional semiconductor device fabricated with a convention mask pattern.
Figure 1B:
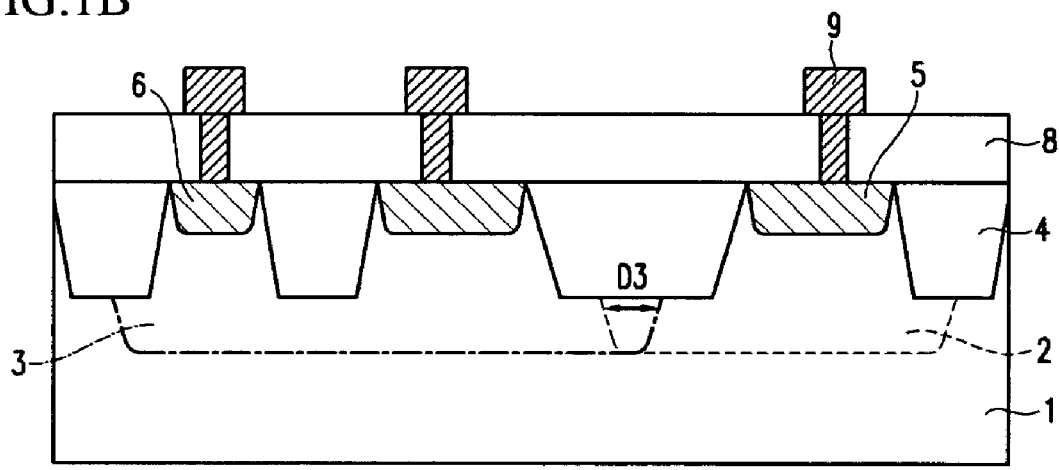
FIG. 1B is a cross sectional view of the semiconductor device of FIG. 1A.
Figure 2A:
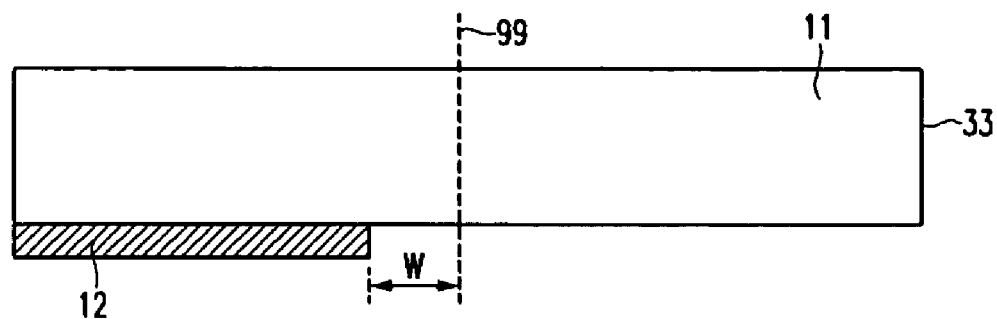
FIGS. 2A and 2B are cross sectional views showing conventional N-well and P-well masks, respectively.
Figure 2B:
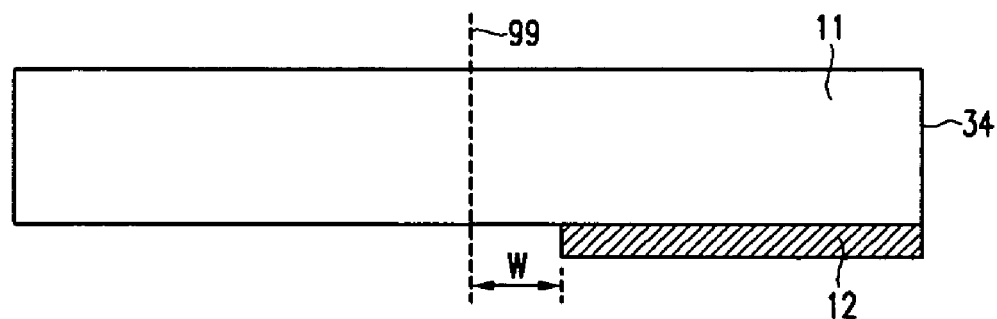
Figure 3:
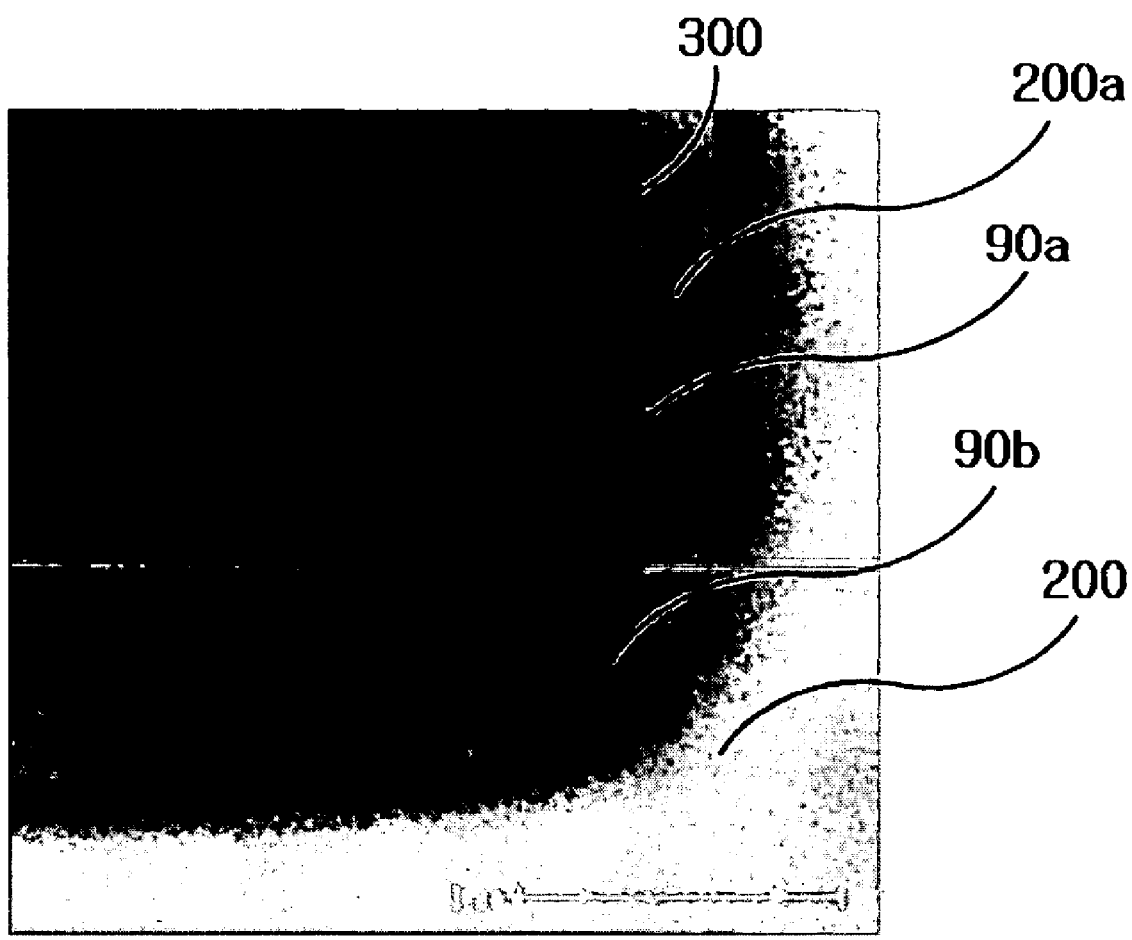
FIG. 3 is a picture illustrating a problem associated with a conventional mask.
Figure 8:
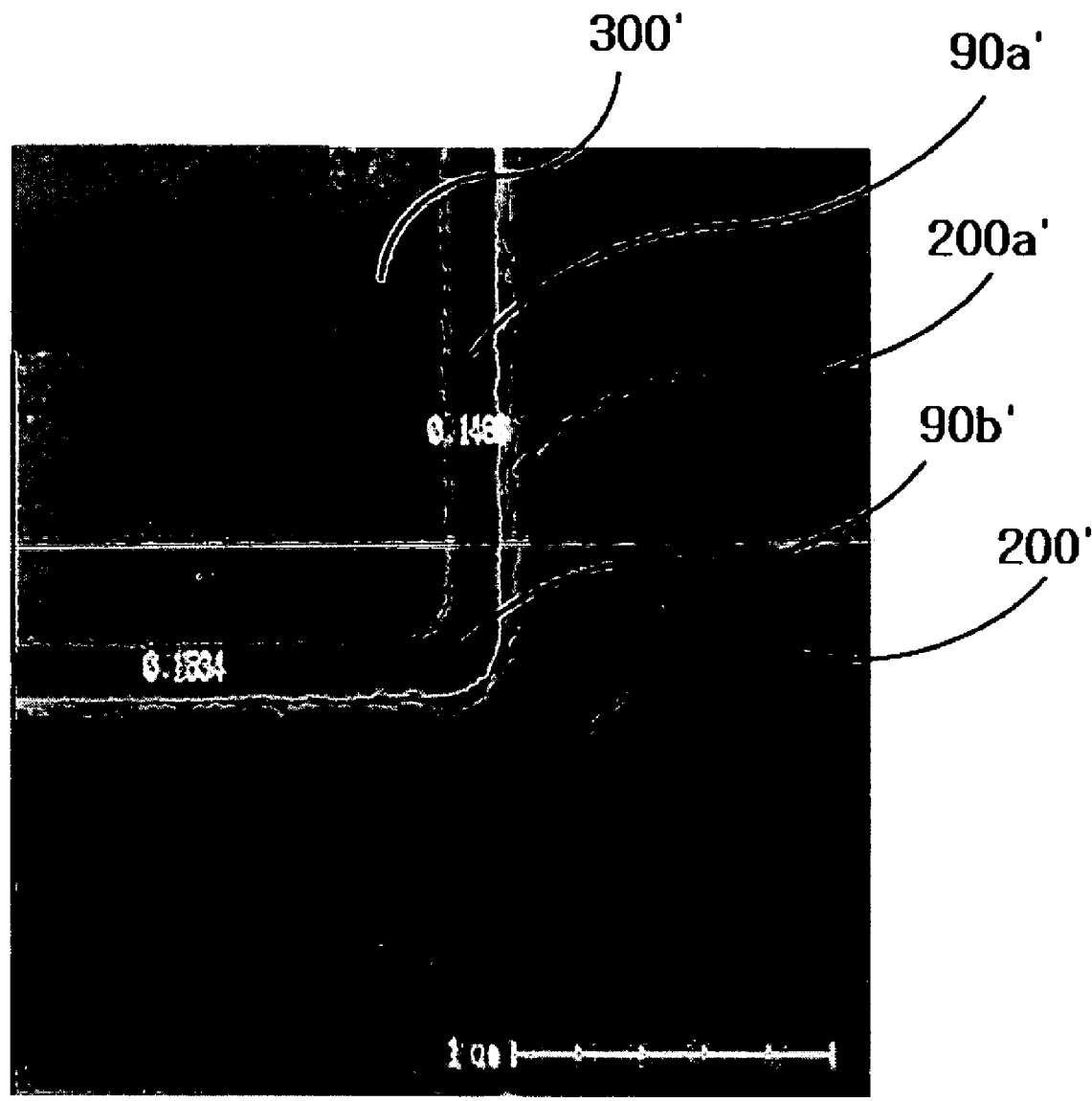
FIG. 8 is a picture illustrating an overlapping region formed in a semiconductor substrate by applying a mask constructed in accordance with the teachings of the present invention.

FIG. 8 is a picture illustrating an example overlapping region formed in a semiconductor substrate by applying an example mask constructed in accordance with the teachings of the present invention. As shown in FIG. 8, the slope 200a' of the resist during a P-well mask exposing process is enhanced, so that overlapping regions 90a', 90b' having a constant width can be ensured (compare FIG. 3).

From the foregoing, persons of ordinary skill in the art will appreciate that, since a sufficient ion implantation overlapping region for a complementary well mask is provided, it is possible to enhance the breakdown voltage. In addition, when a well layer is formed by using a thick resist, since a phase shifting mask having a partial phase shifting function can be applied, it is possible to enhance a slope of a resist during a resist patterning process. In addition, since the well can be accurately formed, it is possible to increase the yield of semiconductor devices.

Persons of ordinary skill in the art will further appreciate that masks for fabricating semiconductor devices and a methods of forming mask patterns have been disclosed which are capable of enhancing the breakdown voltage of the fabricated device by accurately correcting a line width pattern error of a semiconductor substrate due to a mask error during a process for forming a-well ion implantation mask pattern of the semiconductor device.

A disclosed example mask to manufacture a semiconductor device having complementary N and P-wells includes: a master mask for the complementary N-well and P-well; a light-blocking pattern formed on the master mask, wherein a region of the master mask which is not a portion of the master mask adjacent to the light-blocking pattern is etched by a predetermined thickness to achieve a phase shifting function.

A width of a line exposed by the master mask in an exposing process may be in a range of about 0.2 to about 0.8 μm.

In addition, the widths of the lines exposed by the master mask in an exposing process may not be overlapped during respective mask aligning processes for the N-well and P-well.

A disclosed example method of forming a mask to manufacture a semiconductor device having complementary N and P-wells includes: forming a light-blocking pattern on a master mask for the complementary N-well and P-well; forming a first resist pattern on a portion of the light-blocking pattern; etching the light-blocking pattern to form a size adjusting region corresponding to the first resist pattern; patterning a second resist pattern on the etched light-blocking pattern; and etching the master mask by a phase shifting thickness corresponding to the second resist pattern.

A width of a line exposed by the master mask in an exposing process using the second resist pattern may be in a range of about 0.2 to about 0.8 μm.

In addition, the widths of the lines exposed by the master mask in an exposing process using the second resist pattern may not be overlapped during respective mask aligning processes for the N-well and P-well.

From the foregoing, persons of ordinary skill in the art will appreciate that, since a sufficient ion implantation overlapping region for a complementary well mask is formed, it is possible to enhance the breakdown voltage. In addition, when a well layer is formed by using a thick resist, since a phase shifting mask having a partial phase shifting fiction can be applied, it is possible to enhance a slope of a resist during a resist patterning process. In addition, since the well can be accurately formed, it is possible to increase the yield of semiconductor devices.

It is noted that this patent claims priority from Korean Patent Application Serial Number 10-2003-0098325, which was filed on Dec. 27, 2003, and is hereby incorporated by reference in its entirety.

Although certain example methods, apparatus and articles of manufacture have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:

1. A method of forming a photolithography mask comprising:
    forming a light-blocking layer on a light-transmitting mask;
    forming a first resist pattern on a portion of the light-blocking layer;
    etching an exposed portion of the light-blocking layer to form (i) light-blocking pattern corresponding to one of a complementary N-well and P-well and (ii) a size adjusting region comprising an exposed surface of the light-transmitting mask;
    forming a second resist pattern on the light-blocking pattern and a portion of the exposed surface of the light-transmitting mask, including a portion of the size adjusting region; and
    partially etching the exposed surface of the light-transmitting mask by a phase shifting depth to form (i) a phase shifted region and (ii) a non-etched region of the size adjusting region, the non-etched region of the size adjusting region being between the light-blocking pattern and the phase shifted region;
    wherein the size adjusting region increases a slope of the light intensity at an end portion of the phase shifted region relative to an otherwise identical mask that does not include the size adjusting region.

2. A method as defined in claim 1, wherein a width of a line exposed by the light-transmitting mask in an exposing process using the second resist pattern is in a range of about 0.2 to about 0.8 μm.

3. A method as defined in claim 1, wherein widths of lines exposed by the light-transmitting mask in an exposing process using the second resist pattern are not overlapped during respective mask aligning processes for the N-well and P-well.

4. A method as defined in claim 1, wherein the step of etching the exposed surface of the light-transmitting mask forms a non-etched region of the exposed region of the light-transmitting mask corresponding to the size adjusting region.

5. A method as defined in claim 1, wherein the non-etched region has a width of about 0.04 μm.

6. A method as defined in claim 1, further comprising passing light through the light-transmitting mask to form one of the N-well and the P-well.

7. A method as defined in claim 6, further comprising passing additional light through another light-transmitting mask to form the other of the N-well and the P-well.

8. A method as defined in claim 7, wherein the step of forming the N-well and P-well forms an overlap region between the N-well and P-well.

9. A method as defined in claim 1, further comprising forming another light-transmitting mask and forming another light-blocking pattern thereon corresponding to the other of the complementary N-well and P-well.

10. A method as defined in claim 1, wherein the light-blocking layer has a wide slanted surface.

11. A method as defined in claim 5, wherein an amplitude of light passing through the non-etched region has a positive component.

12. A method as defined in claim 5, wherein an amplitude of light passing through the non-etched region has a steep positive component.

13. A method as defined in claim 5, wherein the intensity of light transmitted through the light-transmitting mask is substantially lower in the non-etched region than a partially etched area of the light-transmitting mask.

14. A method as defined in claim 7, wherein the overlap region has a constant width.

* * * * *